US012560663B2

(12) United States Patent
Bowers et al.

(10) Patent No.: US 12,560,663 B2
(45) Date of Patent: Feb. 24, 2026

(54) METHODS AND SYSTEMS FOR PRODUCING HYPERPOLARIZED FLUID SAMPLES

(71) Applicant: University of Florida Research Foundation, Inc., Gainesville, FL (US)

(72) Inventors: Clifford Russell Bowers, Gainesville, FL (US); Maria-Jose Ferrer, Gainesville, FL (US)

(73) Assignee: University of Florida Research Foundation, INC., Gainesville, FL (US)

( * ) Notice: Subject to any disclaimer, the term of this patent is extended or adjusted under 35 U.S.C. 154(b) by 203 days.

(21) Appl. No.: 18/567,084

(22) PCT Filed: Jun. 17, 2022

(86) PCT No.: PCT/US2022/072998
§ 371 (c)(1),
(2) Date: Dec. 5, 2023

(87) PCT Pub. No.: WO2022/266662
PCT Pub. Date: Dec. 22, 2022

(65) Prior Publication Data
US 2024/0264251 A1      Aug. 8, 2024

Related U.S. Application Data

(60) Provisional application No. 63/211,612, filed on Jun. 17, 2021.

(51) Int. Cl.
*G01R 33/28*      (2006.01)

(52) U.S. Cl.
CPC ................................ *G01R 33/282* (2013.01)

(58) Field of Classification Search
CPC ..... G01R 33/282; A61B 5/0515; A61B 5/055; G01N 24/08
See application file for complete search history.

(56) References Cited

U.S. PATENT DOCUMENTS

| | | | |
|---|---|---|---|
| 6,124,226 | A | 9/2000 | Andrew |
| 6,365,695 | B1 | 4/2002 | Ramamurthy |
| 2002/0137965 | A1 | 9/2002 | Axelsson |

(Continued)

FOREIGN PATENT DOCUMENTS

| | | |
|---|---|---|
| WO | 2021025105 A1 | 2/2021 |

OTHER PUBLICATIONS

Bowers, C. R.; Weitekamp, D. P. Parahydrogen and Synthesis Allow Dramatically Enhanced Nuclear Alignment. J. Am. Chem. Soc. 1987, 109 (18), 5541-5542.

(Continued)

*Primary Examiner* — G.M. A. Hyder
(74) *Attorney, Agent, or Firm* — Thomas Horstmeyer LLP.

(57)      ABSTRACT

Embodiments of the present disclosure provide for systems and methods of making, processing, and purifying hyperpolarized fluid samples and fractions thereof as well as detecting and using the hyperpolarized fluid samples. The present disclosure provides for methods and systems of making hyperpolarized fluid sample (e.g., hyperpolarized target molecules), which can be analyzed using a nuclear magnetic resonance (NMR) detection device.

20 Claims, 5 Drawing Sheets

(56) References Cited

U.S. PATENT DOCUMENTS

2020/0261606 A1* 8/2020 Bowers ................. A61K 49/10

OTHER PUBLICATIONS

Reineri, F.; Boi, T.; Aime, S. ParaHydrogen Induced Polarization of 13C Carboxylate Resonance in Acetate and Pyruvate. Nat. Commun. 2015, 6, 1-6.

Korchak, S.; Mamone, S.; Glöggler, S. Over 50 % 1H and 13C Polarization for Generating Hyperpolarized Metabolites—A Para-Hydrogen Approach. ChemistryOpen 2018, 7 (9), 672-676.

Lang, R. J. Ultrasonic Atomization of Liquids. J. Acoust. Soc. Am. 1962, 34 (1), 6-8.

Slegers, S.; Linzas, M.; Drijkoningen, J.; D'Haen, J.; Reddy, N.; Deferme, W. Surface Roughness Reduction of Additive Manufactured Products by Applying a Functional Coating Using Ultrasonic Spray Coating. Coatings 2017, 7 (12), 208.

International Search Report and Written Opinion Received for WO Publication PCT/US22/72998 2022.

* cited by examiner

- $^{13}C$ NMR Detection, 9.4 T
- Catalyst: 10 mM Rh(cod)(dppb)BF$_4$
- 40 mM Propargyl Pyruvate
- Solvent: Acetone-d$_6$
- 6 bar pH$_2$ chamber pressure
- Nozzle Frequency: 120 kHz Allyl Pyruvate
(AP-keto)

LACADENA
sINEPT $\varepsilon = 1629$
$P_{13C}$: 2.11%

LACADENA
sINEPT
1 scan

AP $^{13}C$ Thermal
2048 scans    x 6

164    163    162    161
δ (ppm)

- 13C NMR Detection, 9.4 T
- Catalyst: 10 mM Rh(cod)(dppb)BF₄
- Precursor: 40 mM d-Propargyl Pyruvate
- Solvent: Acetone d₆
- 6 bar pH₂ chamber pressure
- Nozzle Frequency: 120 kHz $\varepsilon \approx 3555$
$P_{13C}: 4.60\%$

METHODS AND SYSTEMS FOR PRODUCING HYPERPOLARIZED FLUID SAMPLES

CROSS-REFERENCE TO RELATED APPLICATIONS

This application is the 35 U.S.C. § 371 national stage application of PCT Application No. PCT/US2022/072998, filed Jun. 17, 2022, which claims the benefit of and priority to U.S. Provisional Application Ser. No. 63/211,612, having the title "METHODS AND SYSTEMS FOR PRODUCING HYPERPOLARIZED FLUID SAMPLES" filed Jun. 17, 2021, the disclosures of which are incorporated herein in by reference in their entireties.

FEDERAL FUNDING

This invention was made with government support under Grant No. 1644779, awarded by the National Science Foundation. The government has certain rights in the invention.

BACKGROUND

Magnetic resonance imaging (MRI) is a versatile and non-invasive diagnostic technique that provides information on anatomical structures. Most applications of MRI rely on the magnetization of water molecules. However, the water MRI signal has limitations. The production of para-water and symmetry-breaking interactions could open the possibility to enhance water signals for in vivo imaging applications. Despite this, the present state of the art has limitations and improvements to the MRI signal are desired.

SUMMARY

Embodiments of the present disclosure provide for systems and methods of making, processing, and purifying hyperpolarized fluid samples and fractions thereof as well as detecting and using the hyperpolarized fluid samples.

The present disclosure provides for a system, comprising: a precursor introduction device, wherein the precursor solution includes a target substrate molecule and a catalyst; a reaction chamber, wherein the precursor introduction device is configured to be in fluidic communication with the reaction chamber, wherein the reaction chamber includes an ultrasonic nozzle that has a surface, wherein the precursor introduction device is configured to deliver the precursor solution to the surface of the ultrasonic nozzle, wherein the ultrasonic nozzle is configured to produce droplets of the sample having an average diameter of from 1 to 50 microns in a droplet distribution range of about 25 microns or less, wherein the reaction chamber includes a collection structure; and a gas introduction system in communication with the reaction chamber, wherein the gas introduction system is configured to introduce parahydrogen into the reaction chamber, wherein the system is configured to expose the parahydrogen and the droplets of the precursor to one another, leading to the formation of the hyperpolarized fluid sample. The system can also include a device for spin order transfer from the protons to one or more heteronuclei. The system can also include a device for chemical processing of the hyperpolarized fluid sample to form a processed hyperpolarized fluid. The system can also include a separation device for processing the processed hyperpolarized fluid to separate a hyperpolarized fluid fraction from one or more of the following: a catalyst, side-reaction product, cleaved molecular fragments, and solvent residues. The system can also include a detection device that is in fluidic communication with the separation device, where the detection device is a nuclear magnetic resonance or magnetic resonance imaging device operating at low or zero magnetic field or high magnetic field. The system is operated in continuous or batch mode.

The present disclosure provides for a method of detecting targeted molecules, comprising: producing droplets of the precursor solution using an ultrasonic frequency, wherein the droplets have an average diameter of 1 to 50 microns in a droplet distribution range of about 25 microns or less exposing a precursor and parahydrogen to a catalyst; and mixing the droplet with parahydrogen to make a hyperpolarized fluid sample. After mixing the droplet with parahydrogen to make the hyperpolarized fluid sample, the method further comprises transferring the hyperpolarized fluid sample to a device for spin order transfer from the protons to one or more heteronuclei. After the spin order transfer, the method comprises introducing the hyperpolarized fluid sample into a device for chemical processing to form a processed hyperpolarized fluid, wherein the chemical processing is selected from one of the following: batch-mode hydrolysis; continuous-flow hydrolysis in a flow reactor system which combines the streams of hyperpolarized fluid with a solution of aqueous chemical base. After chemical processing, the method further comprises introducing the processed hyperpolarized fluid to a separation process to separate a hyperpolarized fluid fraction from one or more of the following: a catalyst, side-reaction product, cleaved molecular fragments, and solvent residues. After the separation process, the method further comprises introducing the hyperpolarized fluid fraction to a detection device or in vivo administration to a subject following by detection of the hyperpolarized fluid fraction using magnetic resonance imaging.

BRIEF DESCRIPTION OF THE DRAWINGS

Further aspects of the present disclosure will be more readily appreciated upon review of the detailed description of its various embodiments, described below, when taken in conjunction with the accompanying drawings.

DETAILED DESCRIPTION

Figures 1A, 1B, 1C:
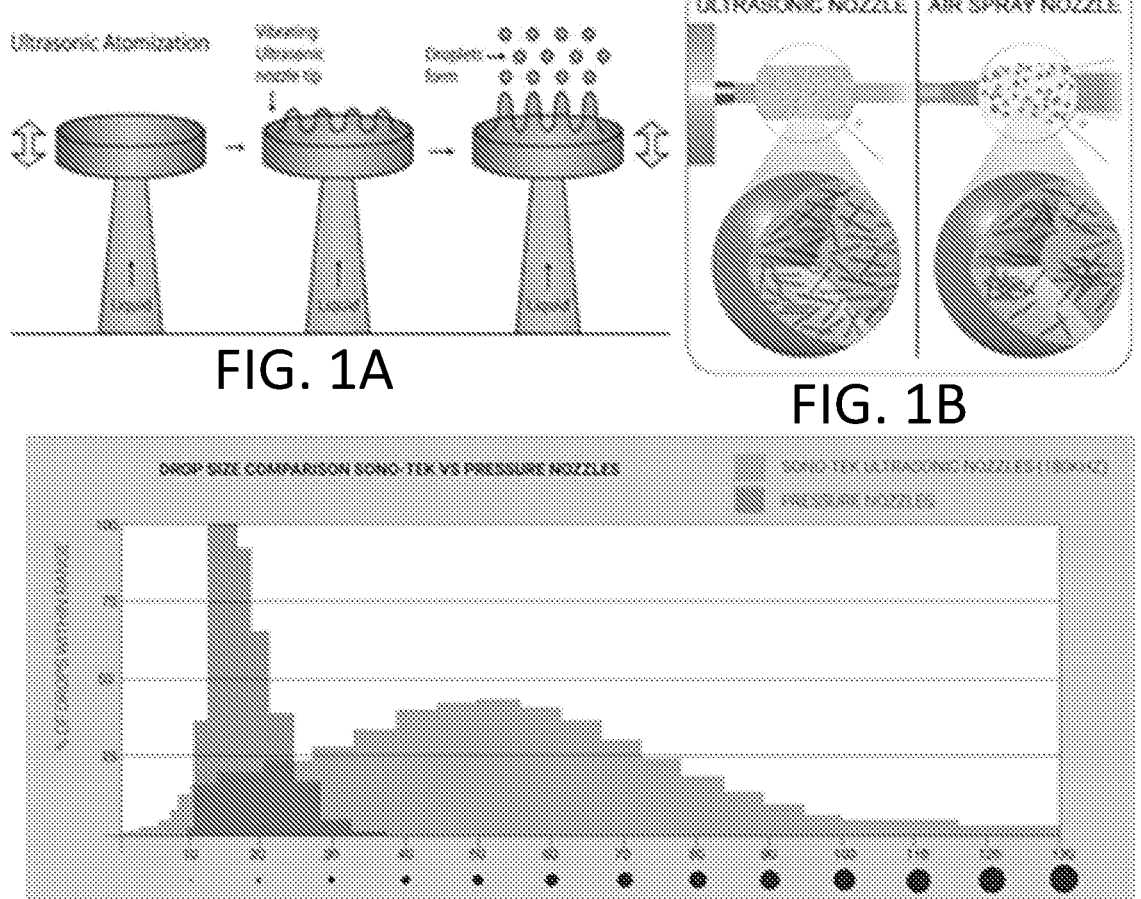
FIG. 1A illustrates droplet formation through ultrasonic atomization.
FIG. 1B illustrates close-up of droplet formation from an ultrasonic nozzle versus air spray (gas) nozzle.
FIG. 1C illustrates distribution of droplet sizes from an ultrasonic nozzle versus a pressure nozzle.

This disclosure is not limited to particular embodiments described, and as such may, of course, vary. The terminology used herein serves the purpose of describing particular embodiments only, and is not intended to be limiting, since the scope of the present disclosure will be limited only by the appended claims.

Where a range of values is provided, each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method may be carried out in the order of events recited or in any other order that is logically possible.

Embodiments of the present disclosure will employ, unless otherwise indicated, techniques of chemistry, medical imaging, biochemistry, pharmacology, medicine, and the like, which are within the skill of the art. Such techniques are explained fully in the literature.

Prior to describing the various embodiments, the following definitions are provided and should be used unless otherwise indicated.

Unless otherwise defined, all technical and scientific terms used herein have the same meaning as commonly understood by one of ordinary skill in the art of microbiology, molecular biology, medicinal chemistry, physical chemistry, and/or organic chemistry. Although methods and materials similar or equivalent to those described herein can be used in the practice or testing of the present disclosure, suitable methods and materials are described herein.

As used in the specification and the appended claims, the singular forms "a," "an," and "the" may include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Definitions

The acronym NMR stands for "nuclear magnetic resonance", where absorption or emission of radiowaves is accompanied by a change in the nuclear spin state in a molecule.

The term "polarization" refers to the difference in fractional populations of two spin states (for example, the spin-up and spin-down quantum states of the proton, denoted $|\uparrow\rangle$ and $|\downarrow\rangle$). Polarization of a spin-½ particle is defined as:

$$P \equiv \frac{N_\uparrow - N_\downarrow}{N_\uparrow + N_\downarrow},$$

where $N\uparrow$ and $N\downarrow$ are the numbers of protons in the spin-up and spin-down states.

| $\|\downarrow\rangle$ | $\|\downarrow\rangle$ | $\|\downarrow\rangle$ |
|---|---|---|
| $\|\uparrow\rangle$ | $\|\uparrow\rangle$ | $\|\uparrow\rangle$ |
| P = 0 | P = +1 | P = -1 |
| Unpolarized | Fully polarized | Fully negatively polarized |

The term "hyperpolarization" refers to a non-thermal equilibrium nuclear spin polarization that is enhanced relative to the thermal equilibrium Boltzmann polarization.

The phrase "hyperpolarized fluid sample" refers to a liquid or gas containing target molecules hosting hyperpolarized nuclear spins.

The phrase "precursor solution" refers to a liquid solvent or solvent mixture containing a catalyst complex or catalyst nanoparticles together with the hydrogenation substrate molecules that incorporate at least one unsaturated chemical moiety (e.g. a double bond, a triple bond, a carbonyl group, or a hydroxy group) to which one or more protons of $H_2$ may be transferred, or alternatively, that becomes hyperpolarized through a spin order transfer mechanism that does not involve chemical transfer of any protons, e.g. by Signal Amplification by Reversible Exchange (SABRE), Surface Waters are Magnetized from Parahydrogen (SWAMP), or Nuclear Exchange Polarization by Transposing Unattached Nuclei (NEPTUN).

The term "parahydrogen" refers to the metastable spin isomer of dihydrogen with proton spins in a singlet state that is antisymmetric with respect to permutation of the two protons. For simplicity, the term parahydrogen will in some cases, depending on the context, also refer to dihydrogen gas that is only partially enriched in the parahydrogen spin isomer content relative to normal hydrogen, which is about 25% parahydrogen and about 75% orthohydrogen (the triplet state, which is symmetric with respect to permutation of the two protons).

The term heteronuclei will refer to the spin-½ isotopes other than the proton, including carbon-13, nitrogen-15, fluorine-19, and phosphorous-31.

DISCUSSION

Embodiments of the present disclosure provide for systems and methods of making, processing, and purifying hyperpolarized fluid samples and fractions thereof. An embodiment of the present disclosure includes methods of making hyperpolarized fluid sample (e.g., hyperpolarized target molecules), which can be analyzed using a nuclear magnetic resonance (NMR) detection device. In general, the hyperpolarized fluid sample can be made by exposing a precursor solution (e.g., including a fluid, target molecules, and a catalyst) to parahydrogen. The interaction and/or chemical reaction between the molecules in the precursor solution and the parahydrogen in the presence of an appropriate homogeneous or heterogeneous catalyst can produce a hyperpolarized fluid sample that includes hyperpolarized protons or heteronuclei on the target molecules, including those metabolites and biomarkers that have been modified by attachment of a temporary ester sidearm containing a double or triple carbon-carbon bond that is chemically removed following the spin order transfer from the hydrogenated sidearm proton spins to observable hyperpolarization of heteronuclei.

In general, the method of making the hyperpolarized fluid sample can include making droplets of a particular size having a particular (e.g., narrow) size distribution using ultrasonic energy. The droplets, which have a very high surface area compared to those produced by bubbling or non-ultrasonic spray-injection methods, are then exposed to gaseous parahydrogen. The precursor, catalyst, and parahydrogen interact and/or react to form the hyperpolarized fluid sample, where a portion (e.g., about 50 to 100%) of the target molecules are hyperpolarized. In an aspect, the target molecule acquires one or more magnetized protons or hydrogen nuclei from parahydrogen by chemical exchange. In another aspect, the spin order of parahydrogen is transferred to the spins in a target molecule without any chemical hydrogenation of the target molecule, as occurs in the hyperpolarization phenomena commonly known as SABRE (Signal Amplification by Reversible Exchange), SWAMP (Surface Waters Are Magnetized from Parahydrogen), and NEPTUN (Nuclear Exchange Polarization by Transposing Unattached Nuclei).

In an aspect, the present disclosure also includes methods of detecting targeted molecules. The method includes producing droplets of the precursor solution using an ultrasonic frequency and mixing the droplet with parahydrogen to make a hyperpolarized fluid sample. The droplets have an average diameter of 1 to 50 microns in a droplet distribution range of about 25 microns or less exposing a precursor and parahydrogen to a catalyst. The method includes delivering a first amount of a sample to a surface of an ultrasonic nozzle using a syringe pump and then producing droplets of the sample using an ultrasonic frequency from the ultrasonic nozzle. The sample can be a homogeneous fluid including the target molecule and a catalyst or the sample can be a heterogeneous fluid including the target molecule and a particle comprising a catalyst.

After mixing the droplet with parahydrogen to make the hyperpolarized fluid sample, the method includes transferring the hyperpolarized fluid sample to a device for spin order transfer from the protons to one or more heteronuclei. The spin order transfer from the protons to one or more heteronuclei is done by one of the following: field cycling of the static magnetic field or radiofrequency field in an NMR spectrometer; coherence transfer radiofrequency pulse sequences in an NMR spectrometer; or adiabatic field cycling in conjunction with coherence transfer radiofrequency pulse sequences in an NMR spectrometer.

After the spin order transfer, the method include introducing the hyperpolarized fluid sample into a device for chemical processing to form a processed hyperpolarized fluid. The chemical processing can include one of the following: batch-mode hydrolysis; continuous-flow hydrolysis in a flow reactor system which combines the streams of hyperpolarized fluid with a solution of aqueous chemical base.

After chemical processing, the method includes introducing the processed hyperpolarized fluid to a separation process to separate a hyperpolarized fluid fraction from one or more of the following: a catalyst, side-reaction product, cleaved molecular fragments, and solvent residues. After the separation process, the method includes introducing the hyperpolarized fluid fraction to a detection device or in vivo administration to a subject following by detection of the hyperpolarized fluid fraction using magnetic resonance imaging.

In an aspect, embodiments of the present disclosure include a system for making the hyperpolarized fluid sample and fractions thereof. In general, the system is configured to expose the parahydrogen to a precursor solution in the form of droplets (e.g., formed into droplets or an aerosol using an ultrasonic nozzle) leading to the production of the hyperpolarized fluid sample (e.g., hyperpolarized target molecules in a neat liquid or solution) that is collected, chemically processed, and analyzed or imaged. The system can include a temperature and pressure-controlled reaction chamber interfaced with a precursor introduction device, a gas introduction device, a device for spin order transfer, a device for chemical processing, a separation and/or purification device, and/or a collection and storage device, and optionally a detection device. The system can be operated in batch or continuous-flow modes.

The precursor introduction device introduces the precursor solution into the reaction chamber that incorporates the ultrasonic nozzle. The gas introduction device can be configured to introduce the parahydrogen to the reaction chamber, where the droplets and the parahydrogen interact to form the hyperpolarize fluid sample, which can be collected or accumulated in the reactor structure, transferred to a device for spin order transfer from the protons to one or more heteronuclei by: (a) field cycling of the static magnetic field or radiofrequency field sequences in an NMR spectrometer; (b) coherence transfer radiofrequency pulse sequences in an NMR spectrometer, or (c) adiabatic field cycling in conjunction with coherence transfer radiofrequency pulse sequences in an NMR spectrometer. Following the spin-order transfer step, the hyperpolarized fluid sample can be introduced into a device for chemical processing to from a processed hyperpolarized fluid by one of the following methods: (a) batch-mode hydrolysis via injection of aqueous chemical base; (b) continuous-flow hydrolysis in a flow reactor system which combines the streams of hyperpolarized fluid with a solution of aqueous chemical base. After chemical processing, the desired hyperpolarized fluid fraction can be separated using a separation device from all other chemical species, including catalysts, side-reaction products, cleaved molecular fragments, and undesired solvent residues. Finally, the purified hyperpolarized fluid can be transferred to a detection device, or in-vivo administration for subsequent detection by magnetic resonance imaging or spectroscopy. The separation and purification process can be carried out by one or more of the following methods: polar/non-polar solvent extraction, evaporation of the more volatile solvent, or continuous in a semi-permeable membrane such as expanded polytetrafluoroethylene (ePTFE) based on differences on solvent polarity or volatility. These collection, storage, and chemical processing and separation devices may be situated in a magnetically shielded container or zone, and may include appropriate static or alternating fields to effectuate the conversion of proton spin order into hyperpolarization of heteronuclei. The hyperpolarized fluid sample can be made in batch mode or in a continuous mode.

Now having described the methods and systems generally, additional details regarding the methods and systems are provided.

In an embodiment, the system can include a precursor introduction device that includes a precursor solution (e.g., the fluid containing the target molecules and the catalyst). The precursor introduction device is configured to be in fluidic communication with a reaction chamber. The reaction chamber can be operated at a temperature of about 25° C. to 300° C. and a pressure between about 1 bar to 100 bar. The reaction chamber includes an ultrasonic nozzle that has a vibrating surface. The sample introduction device is configured to deliver the sample to the surface of the ultrasonic nozzle tip. An ultrasonic nozzle may include a titanium horn body and a crystal/ceramic element with piezoelectric properties protected within a stainless-steel rear and front housing. Piezoelectric elements can include crystalline materials such as quartz, gallium orthophosphate, langasite, lithium tantalate, lithium niobate. Alternatively, piezoelectric ceramics that have been reported include barium titanate, potassium niobate, sodium tungstate, and the most commonly used lead zirconate titanate. Active and ground electrodes on the faces of the piezoelectric elements allow for an electrical connection to an ultrasonic generator. A liquid feed tube can be situated through the titanium horn body, for example, to the tip of the atomizing surface. The atomizing surface shape can be conical, focused, or flat depending on the desired spray pattern. The production of the droplets results from the inverse piezoelectric effect, where high frequency (acoustic) sound waves are converted to mechanical energy to produce a vibrating surface. Transduction of the vibrations into the liquid phase produces standing waves in the liquid precursor solution and the amplitude of the surface increases until the liquid film becomes unstable and collapses into a fine mist of uniformly sized droplets. The ultrasonic nozzle can operate at a frequency ranging from about 20 kHz to 3 MHz to produce droplets of the precursor solution having diameters between 1 and 50 microns, depending on the operating frequency of a given nozzle. The high surface-to-volume ratio of droplets formed by the ultrasonic nozzle favors rapid diffusion of gaseous parahydrogen across the liquid/gas interface and into the interior of the liquid droplet within a relatively short time-scale. The droplet diameter and size distribution can be tailored to maximize the hydrogenation reaction rate, conversion, and resultant hyperpolarization level in the collected fluid sample. The reaction chamber can have a volume sufficient to produce the desired volume of hyperpolarized fluid sample for in-vivo use, for example. In this regard, the reaction chamber has a volume of about 1 to 15 mL. The reaction chamber can be made of materials such as stainless steel, aluminum, polysulfone, vespel, polytetrafluoroethylene (PTFE), perfluoroalkoxy alkane (PFA), or polyether ether ketone (PEEK). In an aspect, the ultrasonic nozzle is located at the top of the reaction chamber and a collection vessel is located at the bottom of the reaction chamber to collect the droplets as they move through the reaction chamber. The reaction chamber can have a length of about 2-6 inches and a width or diameter of about 1 to 3 inches.

The parahydrogen is introduced to the reaction chamber using a gas introduction system that is in gaseous communication therewith. The gas introduction system can be configured to controllably introduce parahydrogen into the reaction chamber. The gas introduction device can include appropriate equipment to acquire (if part of a different system) and/or flow the parahydrogen into or through the reaction chamber. For example, the gas introduction system can include tubing, flow valves, pressure gauges, pressure regulators, syringe pumps, thermocouples, flow meters, and the like to control introduction into the holding vessel through the inlet port and purging through an outlet port.

The system can include the device for spin order to transfer from the protons to one or more heteronuclei, the device for chemical processing to from the processed hyperpolarized fluid, and the separation device (and purification device) to separation undesired materials from the desired hyperpolarized fluid (or fraction thereof). The system is configured to transport materials between each of the devices or components of the system. Also, each device or component of the system can operate in batch mode or in a continuous mode.

In a particular aspect, the system also includes the detection device that is in fluidic communication, indirectly or directly, with the collection vessel or structure of the reaction chamber and intermediate chemical processing and separation systems. The system is configured to transfer the hyperpolarized fluid sample from the reaction chamber to the detection device, indirectly or directly depending upon the set up. The time between the formation of the droplets to analysis of the hyperpolarized fluid sample is about 100 ms to 2 s or less than about 5 seconds, about 10 second, or 16 seconds a time-scale determined by the spin-lattice relaxation time of the hyperpolarized nuclei. The system is designed to deliver the hyperpolarized liquid on a time-scale that is short compared to the spin-lattice relaxation time of the protons or heteronuclei. Proton spin relaxation times of several minutes or more have been reported in selectively deuterated molecules in liquid phases. When the hyperpolarized product is produced in a singlet state, pseudo-singlet state, or other symmetry-protected spin state comprised of more than two spins, the delivery to the detection device is performed on a time-scale that is short compared to the lifetime of that spin state. Heteronuclei such as carbon-13 can exhibit spin relaxation times of several minutes. The detection device can be an NMR spectrometer. The NMR spectrometer can be configured for batch mode spin order conversion of proton spin order into hyperpolarization of heteronuclei, or it can be equipped with a flow probe for continuous mode conversion of spin order.

The liquid precursor introduction device can be a device that can inject a measured amount of the liquid precursor into the reaction chamber. In an aspect, the liquid precursor introduction device can be a syringe pump or HPLC pump configured to deliver a first amount of the liquid precursor solution to the surface of the ultrasonic nozzle. The liquid precursor introduction device can be a device that can continuously inject the liquid precursor into the reaction chamber at a designated rate, while the hyperpolarized product liquid is continuously removed from the chamber at the same rate, to maintain a steady-state, continuous-flow production of the hyperpolarized liquid.

In an aspect, the sample can be a homogeneous fluid including the solvent, the substrate molecule and a catalyst, where the catalyst is dissolved in the fluid. In another aspect, the sample, the sample is a heterogeneous fluid including the target molecule and a particle comprising a catalyst, where the catalyst is insoluble in the fluid or is in the form of a suspension or emulsion of catalytic nanoparticles.

In an aspect, the fluid can be an aprotic solvent. The aprotic solvent can include: dioxane, nitromethane, acetonitrile, acetone, dichloromethane, or a combination thereof. In an aspect, the aprotic solvent can be a perdeuterated and partially deuterated form of each of the solvents listed above or herein. In an embodiment, the fluid is perdeuterated or partially deuterated water and is diluted in the aprotic solvent. In an embodiment, the fluid is biphasic, including immiscible polar and non-polar liquids.

In an aspect, the targeted molecule can include a functional group such as: —OH containing molecules, molecules including an amide or an amino group, an amino acid, a sugar, a carboxylic acid, a combination thereof, or any other moiety with an exchangeable proton. The target molecules can be any molecule including the one or more of the functional groups described above or herein. The targeted molecule can be side-arm modified metabolites such as allyl or propargyl esters of acetate, pyruvate, or arginine, or hydrogenation substrates yielding fumarate or succinate upon hydrogenation and a combination thereof.

The catalyst can be a solid (heterogeneous) or liquid (homogeneous). The catalyst can be a compound that is soluble in the fluid. The catalyst can be a metal-based compound or a non-metal based compound. In another aspect, the catalyst is insoluble or substantially insoluble in the fluid. In an embodiment, the catalyst can be a Group VIII, IB, or IIB transition metal-based catalyst including one or more metals (e.g., a bimetallic catalyst). In an aspect, the catalyst can include a one or more of the following: Pt, Pd, Cu, Au, Ag, Rh, Ru, Ir, Ni, Sn, Co, Zn, Ce, Ti, Al, Fe, Si or O. In an embodiment, at least one of the following are included in the catalyst: Pt, Pd, Cu, Au, Ag, Rh, Ru, Ir, Co, Fe, Ni, or L, where L is any lanthanide. In an aspect the catalyst is a metal complex including one or more of the metals described herein. For example, the liquid catalyst can include Rh(cod)(dppb)BF$_4$, Rh(nbd)(dppb)BF$_4$, RuCp* (CH$_3$CN)$_3$]PF$_6$, or other cationic hydrogenation catalyst analogs. In another aspect, the catalyst is a solid and can be one or more of the following alloy or intermetallic compositions: PtSn, Pt$_3$Sn, PtPd, PtBi, PtZn, Pt$_3$Zn, PtRu, PtRh, PtPb, Pt$_3$Co, Pt$_3$Ti, Pt$_3$V, Pt$_3$Ni, PtAu, PtFe, PtCu, PtGe, PtIr, PdCu, AuCu, CuFe, FeMnCu, CuNi, CuRu, CuCo, CuAg, AuPd, PdNi, PdFe, PdRu, PdSn, PdBi, PdPb, AgPd, PdCo, PdMn, PdIr, RhCo, RhAg, RhFe, RhGe, RhIn (or RhIn$_3$) RhNi, RhRe, RhSn, RuCo, RuSn, RuAg, NiRu, RuCr, IrNi, CoIr, or AuAg. The catalyst can be a nanoparticle having a longest dimension (e.g., diameter) of about <1 nm to 20 nm. The metal or bimetallic nanoparticles may be supported on an oxide (e.g., SiO$_2$ (e.g., SBA-15, MCM-41), Al$_2$O$_3$, TiO$_2$) or it may include a metal organic framework (MOF) or covalent organic framework (COF) materials. The metal or bimetallic nanoparticles may include a ligand stabilized metal nanoparticle suspension, dispersion, or emulsion. In an embodiment, the catalyst does not contain any metal atoms. The catalyst may be an alloy, intermetallic compound, comprised of separated single atoms, single sites, or metal clusters that may or may not undergo metal-support interactions to stabilize the catalyst structure to prevent agglomeration and sintering.

The amount of catalyst in the precursor solution and in each droplet should be sufficient to provide enough active sites to accommodate hyperpolarization of the desired number of target molecules. Ideally, the total number of active sites of the catalyst in the volume of precursor solution that is introduced into the reaction chamber should be sufficient to allow complete conversion of all precursor molecules to hyperpolarized target molecules. Concentrations of precursor, parahydrogen, and catalyst are appropriate for hyperpolarization either by exchange of one or more magnetized protons from adsorbed parahydrogen or by non-hydrogenative mechanisms induced by intra- or inter-molecular spin-spin couplings. In the case of catalyst nanoparticles, the amount of catalyst required can depend on the particle size, as the surface to volume ratio scales as 1/r, where r is the particle radius (assuming a spherical particle shape), the surface composition, and the rate of exchange, as well as the type of catalyst.

The system can include multiple different configurations including one or more reaction chambers and/or one or more ultrasonic nozzles. In an embodiment, the gas introduction device can be configured to introduce the parahydrogen to the reaction chamber, where the droplets and the parahydrogen interact to form the hyperpolarize fluid sample, which can be collected, stored, and transferred to the device for spin order transfer from the protons to one or more heteronuclei, before introduction to a device for chemical processing and/or separation, and/or prior to transfer to the detection device, or in-vivo administration for subsequent detection by magnetic resonance imaging or spectroscopy. In an embodiment, the reaction chamber can include multiple ultrasonic nozzles and/or the system can include multiple reaction chambers that are in communication (indirectly or directly) with the same collection or detection device. The precursor introduction system can direct the flow of the precursor solution to one or more reaction chambers and/or one or more ultrasonic nozzles. Depending upon the type and/or amount of target molecules, the configuration of the system can be adjusted to produce the desired results. For example, the system can be configured either for batch or for continuous flow mode production of hyperpolarized liquids.

In another embodiment, the present disclosure provides for methods of collecting, storing, processing, purifying, redistributing nuclear spin order, and detecting the protons spins and heteronuclei of hyperpolarized molecules produced by ultrasonic spray injection into parahydrogen. The method can be implemented using the systems provided herein. The method can be combined with established methods for converting proton spin hyperpolarization derived from parahydrogen into hyperpolarization of heteronuclei. In an aspect, the method can include delivering a first amount of a precursor solution to a surface of the ultrasonic nozzle using a syringe pump and then producing droplets of the sample using an ultrasonic frequency from the ultrasonic nozzle. The method can include producing droplets of the precursor solution using an ultrasonic frequency (e.g., about 20 kHz to 3 MHz) to produce droplets that have an average diameter of about 1 to 50 microns in a droplet distribution range of about 25 microns or less or as otherwise described herein. The droplets are mixed with the parahydrogen to initiate a chemical reaction or polarization transfer process that results in a hyperpolarized fluid sample. Subsequently, the hyperpolarized fluid sample is collected and can be analyzed using a detection device such as an NMR or magnetic resonance imaging system at high or low magnetic fields or zero magnetic field.

The extension of this embodiment to in-vivo administration and imaging of the hyperpolarized sample for detection or monitoring of metabolism, disease detection, and monitoring is also envisioned While embodiments of the present disclosure are described in connection with the Examples and the corresponding text and figures, there is no intent to limit the disclosure to the embodiments in these descriptions. On the contrary, the intent is to cover all alternatives, modifications, and equivalents included within the spirit and scope of embodiments of the present disclosure.

Example 1

Parahydrogen-Induced Polarization (PHIP) is a hyperpolarization method for sensitivity-enhanced nuclear magnetic resonance (NMR) spectroscopy and magnetic resonance imaging (MRI).[1] For the non-specialist, the term "hyperpolarization" means a specially prepared, non-equilibrium state of the proton spins in a molecule that makes the molecule more easily detected. As biomarkers for disease detection and monitoring, hyperpolarized metabolites (HMs) can facilitate kinetic studies of metabolic processes and can provide enhanced contrast in MRI imaging of disease. However, a basic requirement of this approach is that the metabolite of interest must be formable by hydrogenation of a corresponding unsaturated precursor. This has severely limited the scope of molecules that can be hyperpolarized from parahydrogen. As a workaround, Parahydrogen Induced Polarization by Side-Arm Hydrogenation (PHIP-SAH) allows for unsaturated ester conjugates attached to the molecule of interest to undergo hydrogenation with parahydrogen. Polarization transfer from hyperpolarized protons to bio-relevant heteronuclei such as $^{13}C$ or $^{15}N$ has been accomplished through magnetic field cycling or radio-frequency NMR pulse sequences followed by side arm cleavage by means of hydrolysis, thereby releasing the hyperpolarized metabolite of interest into an aqueous phase.[2-3]

Liquid phase PHIP experiments are typically performed by bubbling parahydrogen through a solution containing a dissolved rhodium catalyst and the side-arm precursor. The reaction rate, hyperpolarization levels, and polarization yields achieved by the conventional bubbling method are limited by the rate of molecular transport and mixing. Moreover, polarization levels and yields of metabolites are limited by the short bubbling times required to minimize spin-lattice relaxation losses following the chemical addition of parahydrogen. In vivo applications require HMs to be injected within the first ten seconds after hydrogenation as spin-lattice relaxation begins immediately following the addition of parahydrogen. While lower concentrations of substrate are more effective for high conversion in the hydrogenation reaction, providing a higher yield of HMs, high concentrations and high polarization levels are required for HM observation. Fast production of bulk hyperpolarized substrates has been accomplished using a spray injection system. Gas-driven spray injection has been successfully employed to create large amounts of hyperpolarized substrates with high gas/liquid interfacial surface area; however, the distribution of the droplet size is highly dispersed and difficult to control, as illustrated in FIG. 1B.

In this example, we experimentally demonstrate spray injection using an ultrasonically vibrated nozzle to provide a means to optimize the formation of uniform microdroplets. Compared to conventional gas spray nozzles, the ultrasonic nozzle methodology achieves faster and more efficient mixing of the liquid phase reactants and pressurized para-enriched hydrogen gas, creating high polarization yield of HMs. The production of these microdroplets relies on the inverse piezoelectric effect, where high frequency (acoustic)

sound waves are converted to mechanical energy to produce a vibrating surface. Transduction into the liquid phase produces standing waves in the catalyst/substrate solution. The amplitude of the surface increases until the liquid film becomes unstable and collapses into a fine mist of uniformed droplets as shown in FIG. 1A-1C.[4-5] While ultrasonic nozzles are used widely used in scientific and industrial applications, their use for mixing of reactants in parahydrogen enhanced NMR has never been proposed or demonstrated. Creating droplets in an aerosol with high uniformity and surface area, i.e., microdroplets, from the atomization process could maximize catalytic hydrogenation yield while minimizing spin-lattice relaxation losses. Utilization of ultrasonic atomization allows for tunable and uniform microdroplets of the catalyst and substrate solution during hydrogenation which in turn could promote highly efficient para-hydrogenation of HMs.

Figure 2:
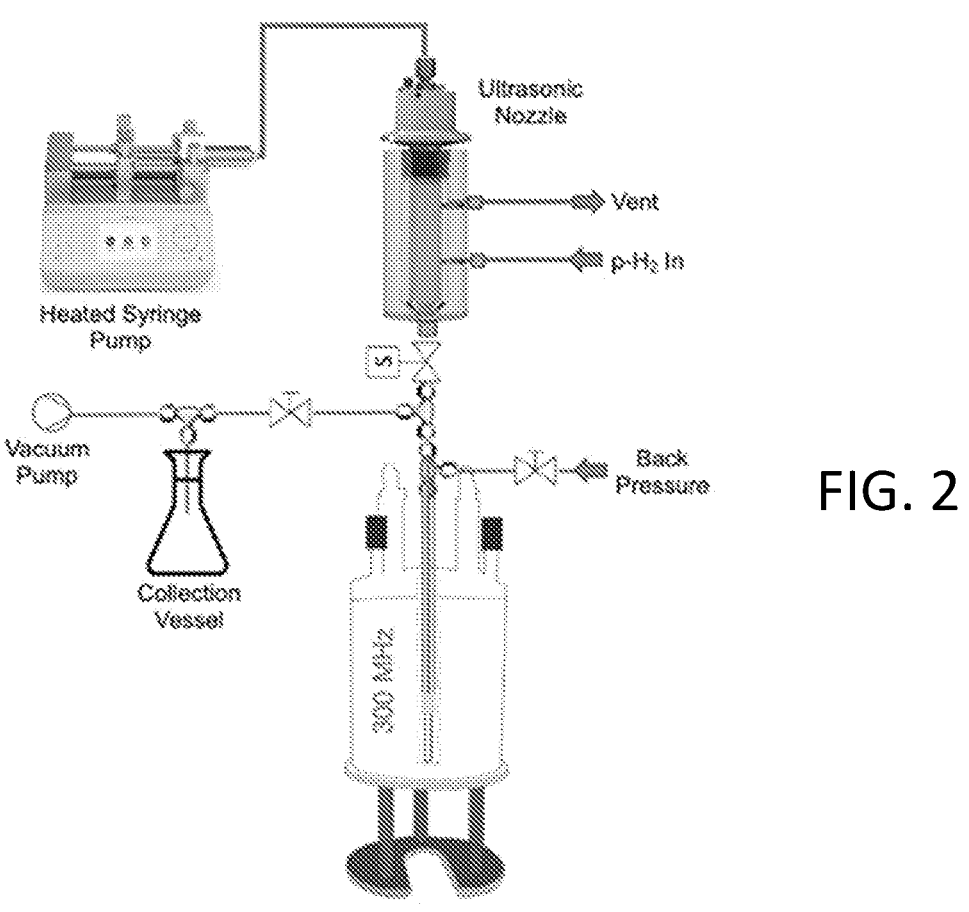
FIG. 2 illustrates a schematic of one possible implementation of the ultrasonic spray injection parahydrogen enhanced NMR system.
Figure 3:
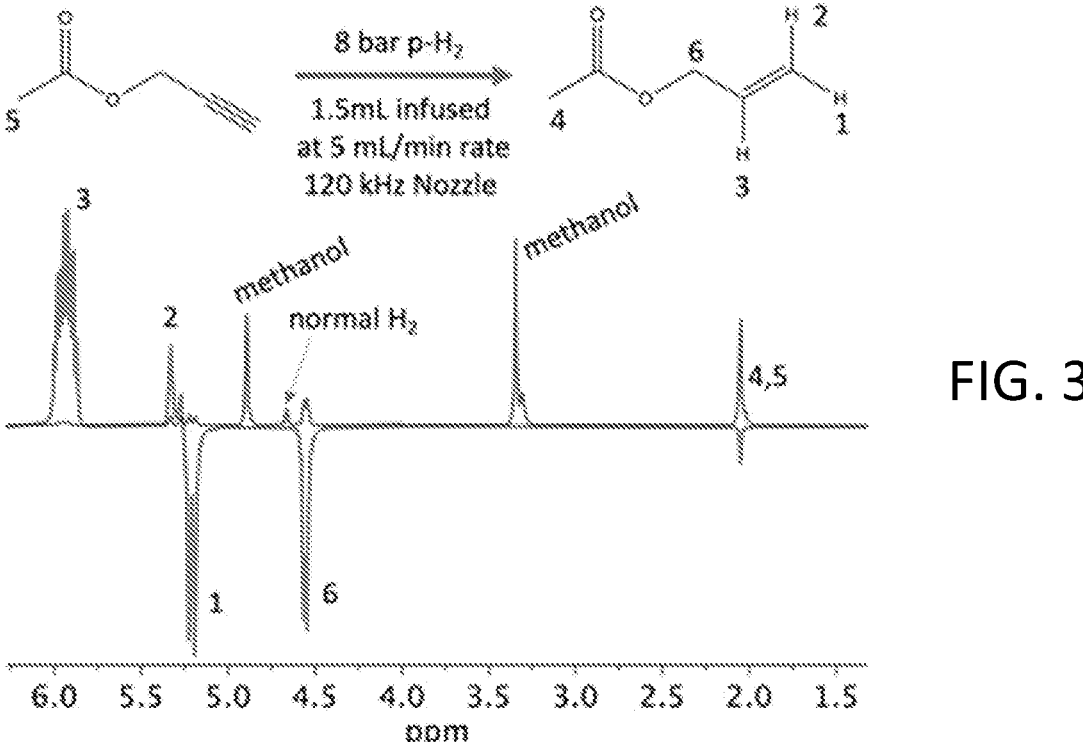
FIG. 3 presents an overlay of two 300 MHz $^1$H NMR spectra acquired immediately after mixing a solution of Rh(cod)(dppb)BF$_4$ catalyst and propargyl acetate by ultrasonic spray injection into a reaction chamber pressurized with (i) 50% para enriched H$_2$ (the spectrum exhibiting both enhanced absorption and emission NMR peaks) or (ii) normal H$_2$ (the spectrum showing only absorption NMR peaks). The nozzle frequency was 120 kHz at a flow rate of 5 mL/min and temperature of 50° C.

Ultrasonic atomized spray injection allows substrates to form a narrow distribution of droplets (see FIG. 1C) in the form of an aerosol; therefore, a suitable reaction chamber has been constructed in our lab. The spray injection design incorporates a Sono-Tek™ ultrasonic nozzle in a polysulfone reaction chamber mounted above an in-lab 7T NMR magnet as shown in FIG. 2. The precursor solution is prepared, placed into a syringe pump for heating, and infused into the ultrasonic nozzle creating HMs. Testing of the apparatus has been performed using commercially available propargyl acetate, a model PHIP-SAH precursor. Preliminary data has shown that increasing hydrogen concentration within the chamber has produced more HMs. The selected chamber pressure is 8 bar. Other ultrasonic atomization parameter studies such as infusion rate and nozzle power have been tested as there is a minimum contact time and power necessary to create uniform droplets on the nozzle tip. We have found that an infusion rate of 5 mL/min and a nozzle power of 3.5 watts yields sufficient hyperpolarized product by $^1H$ NMR as shown in FIG. 3.

The optimized ultrasonic parahydrogen spray injection reactor system can deliver higher performance than air-injection systems due to the narrow distribution of the micron-scale droplet sizes obtained in the ultrasonic process. With the utilization of parahydrogen enhanced NMR techniques in the in-vivo testing phase, the introduction of ultrasonic nozzle spray injection technology is likely to have a profound effect of the field with excellent commercialization potential.

REFERENCES

1. Bowers, C. R.; Weitekamp, D. P. Parahydrogen and Synthesis Allow Dramatically Enhanced Nuclear Alignment. *J. Am. Chem. Soc.* 1987, 109 (18), 5541-5542.
2. Reineri, F.; Boi, T.; Aime, S. ParaHydrogen Induced Polarization of 13 C Carboxylate Resonance in Acetate and Pyruvate. *Nat. Commun.* 2015, 6, 1-6.
3. Korchak, S.; Mamone, S.; Glöggler, S. Over 50% 1H and 13C Polarization for Generating Hyperpolarized Metabolites-A Para-Hydrogen Approach. *ChemistryOpen* 2018, 7 (9), 672-676.
4. Lang, R. J. Ultrasonic Atomization of Liquids. *J. Acoust. Soc. Am.* 1962, 34 (1), 6-8.
5. Slegers, S.; Linzas, M.; Drijkoningen, J.; D'Haen, J.; Reddy, N.; Deferme, W. Surface Roughness Reduction of Additive Manufactured Products by Applying a Functional Coating Using Ultrasonic Spray Coating. *Coatings* 2017, 7 (12), 208.

Example 2

Figure 4:
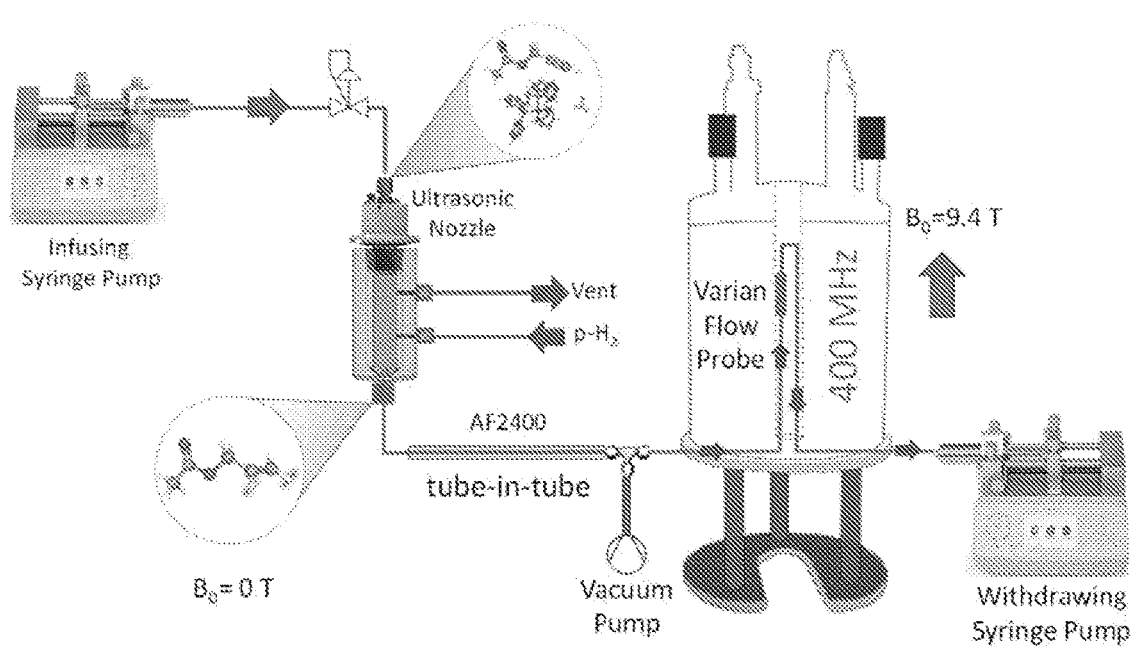
FIG. 4 presents a block diagram of the ultrasonic spray injection reactor and dual syringe pump transport apparatus used to implement the experimental protocols illustrated in FIGS. 5A and 5B.

Example 2 illustrates aspects of the method and device of the present disclosure. FIG. 4 presents the ultrasonic spray injection and transport setup apparatus used to implement the experimental protocols illustrated in FIGS. 5A and 5B. Initially, the entire length of tubing connecting the "Infusing Syringe Pump" and the "Withdrawing Syringe Pump," including the tubing and flow cell within the flow NMR probe, are completely filled with liquid solvent. The infusing syringe pump is filled with the degassed precursor solution containing the unsaturated side-arm ester and the hydrogenation catalyst. The precursor solution is infused through the ultrasonic nozzle which introduces micro-droplets of the precursor solution into the reaction chamber pressurized with para-enriched $H_2$ gas. After collection of the liquid hydrogenation products at the bottom of the reactor, the withdrawing syringe pump is activated to pull the liquid into the flow NMR probe at a controlled rate. This rate may be variable in order to maintain constant-adiabaticity criterion throughout the process which will reduce losses and maximize the final polarization on the target heteronucleus. Once the NMR flow cell has been filled, the withdrawing syringe pump is stopped, and the selective INEPT pulse sequence is applied for conversion of the parahydrogen-derived proton spin hyperpolarization into carbon-13 spin order, as shown in FIGS. 5A and 5B.

Figure 5A:
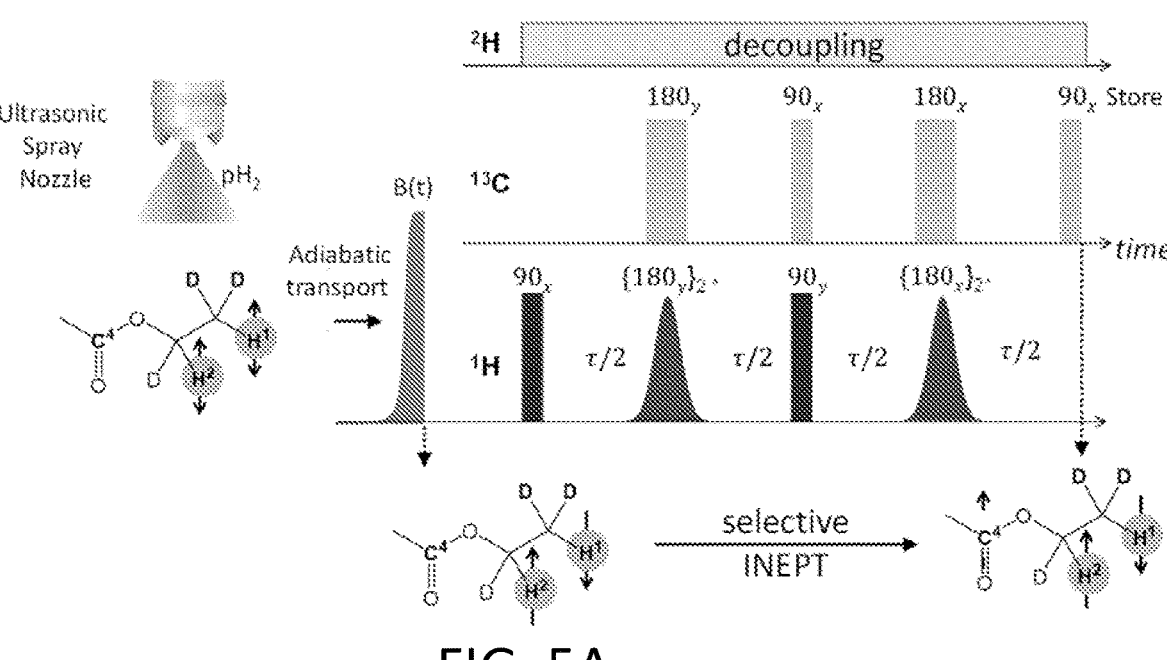
FIG. 5A shows a timing diagram for the preparation of hyperpolarized metabolites using ultrasonic spray injection into a reaction chamber pressurized with para-enriched hydrogen in conjunction with adiabatic transport and a selective-INEPT radiofrequency pulse sequence, suitable for precursors like ethyl pyruvate (AP) or ethyl acetate (AA). At the bottom, the black arrows superimposed on the atoms indicate the spin state of each nucleus in the molecule following the addition of $pH_2$ (in pink) at each step of the pulse sequence.

FIG. 5A shows a timing diagram for the preparation of hyperpolarized metabolites using ultrasonic spray injection in conjunction with adiabatic transport and selective-INEPT pulse sequence, suitable for precursors like ethyl pyruvate (AP) or ethyl acetate (AA). At the bottom, the black arrows superimposed on the atoms indicate the spin state of each nucleus in the molecule following addition of $pH_2$ (in pink) at each step of the sequence. FIG. 5B shows the timing diagram for the experiment, suitable for side-arm precursors such as allyl pyruvate (AP) or allyl acetate (AA). For the allyl side-arm, again, the black arrows superimposed on the molecule at the bottom indicate the spin state at each step in the pulse sequence. Here, the relay proton $H^3$ is shaded light green. After rapid adiabatic passage through the level anticrossing (LAC), $H^3$ becomes polarized at the expense of $H^1$. In the second step of either experiment, the selective coherence transfer (sINEPT) RF pulse sequence, which in principle is lossless and 100% efficient, is applied to move the spin polarization to $^{13}C$. For $^{13}C$ NMR detection, the final 90× storage pulse would be omitted.

Figures 5B, 6A:
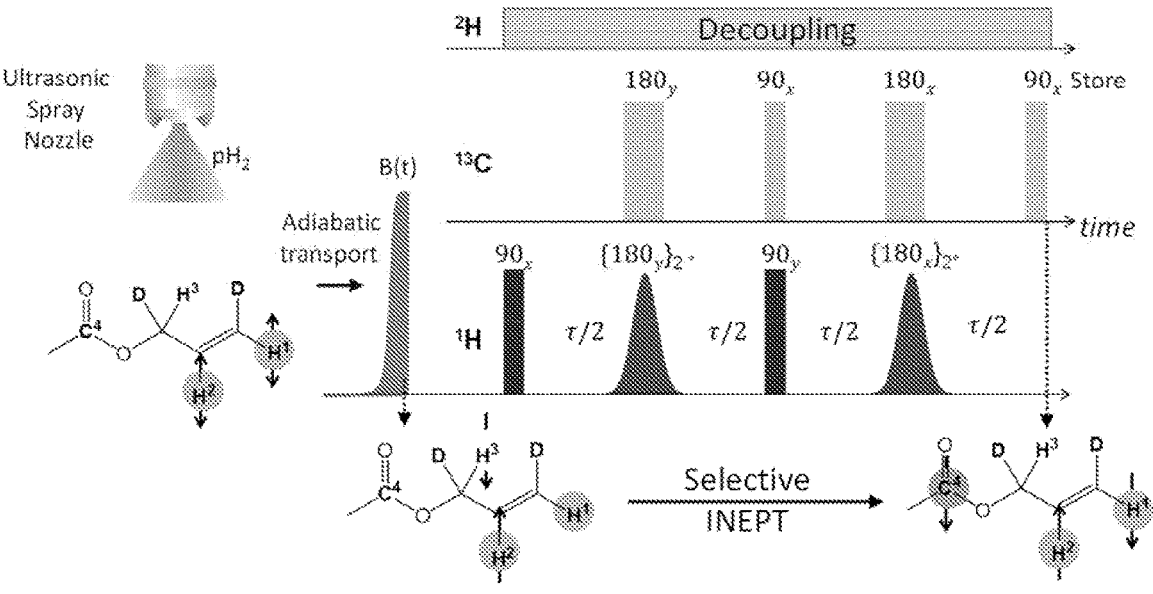
FIG. 5B shows the timing diagram for the experiment, suitable for side-arm precursors such as allyl pyruvate (AP) or allyl acetate (AA).
FIGS. 6A and 6B present representative experiment results obtained using the system of the present disclosure performed with propargyl pyruvate (FIG. 6A) and d-propargyl pyruvate (FIG. 6B), respectively, as the hydrogenation substrates.
Figure 6B:
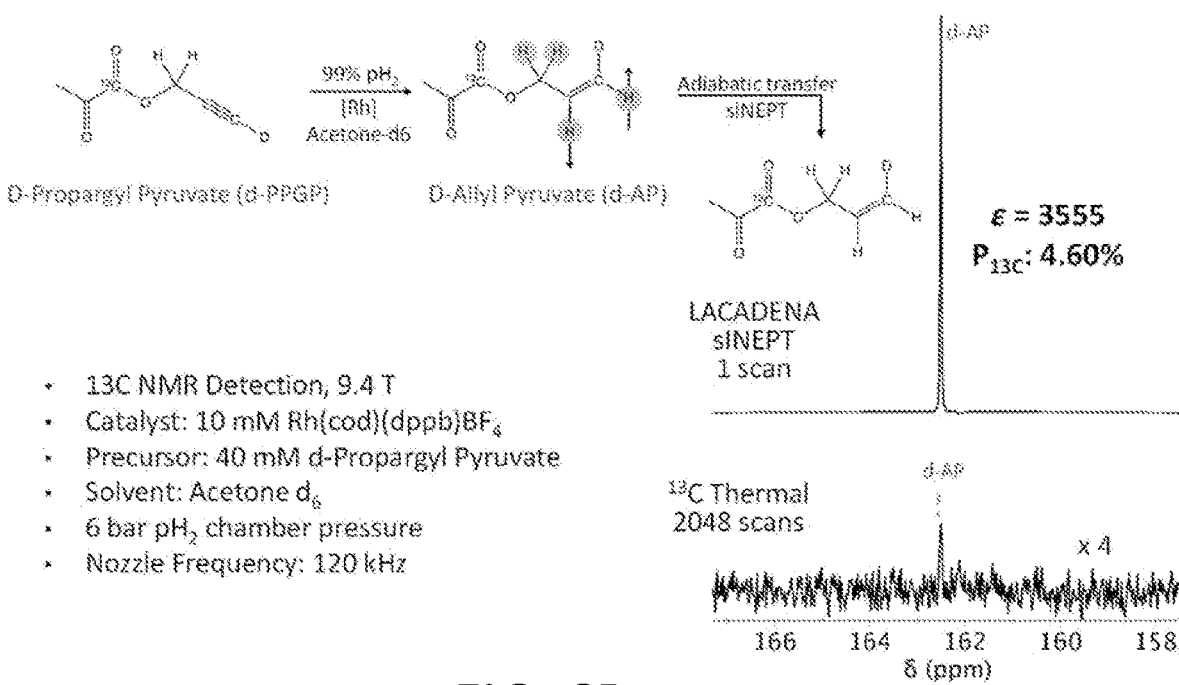

FIGS. 6A and 6B presents experiment results using the system of the present disclosure performed with propargyl pyruvate (FIG. 6A) and d-propargyl pyruvate (FIG. 6B), respectively. The experimental conditions are provided in the figure. The carbon-13 NMR signal enhancements of 1629 and 3555 were observed, respectively, corresponding to absolute carbon-13 polarization levels of 2.11% and 4.60%, respectively. These results confirm the significant improvement in the carbon-13 polarization that results from deuteration of the propargyl terminal CH group. Furthermore, the theoretical simulations indicate an additional factor of two will be gained by single deuteration of the $CH_2$ group of the propargyl side-arm.

Figure 7:
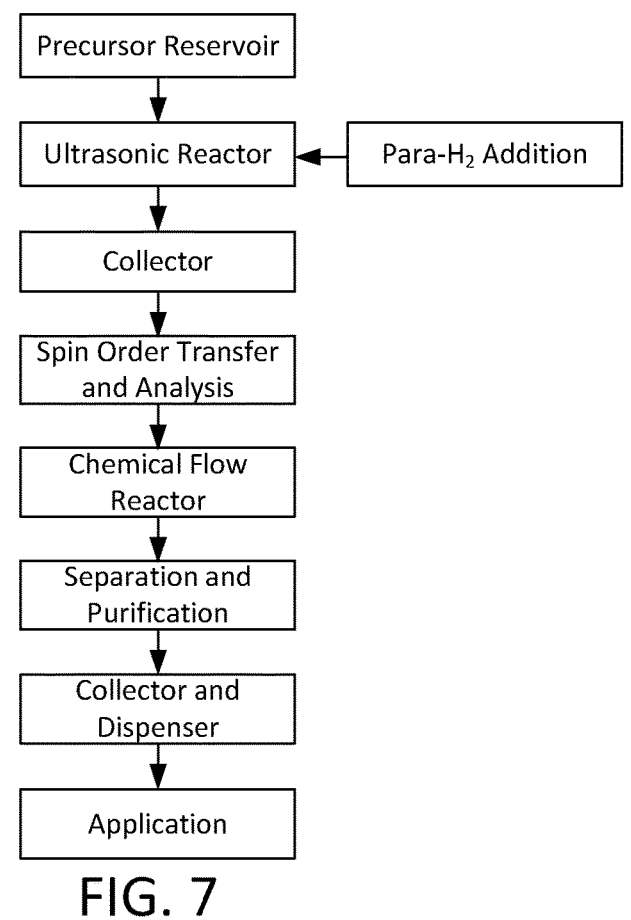
FIG. 7 presents a flow chart of the overall process for hyperpolarization of a metabolite from parahydrogen utilizing an ultrasonic reactor device in a flow or batch-mode operation.

FIG. 7 presents a flow chart of an embodiment of the overall process for hyperpolarization of a metabolite from parahydrogen utilizing an ultrasonic reactor device in a flow or batch-mode operation. The precursor solution is infused into the ultrasonic reactor that is pressurized with parahydrogen. After incorporating the proton's spin order from parahydrogen by hydrogenative or non-hydrogenative interactions, the hyperpolarized liquid is collected and then transported to the spin order transfer device, which redistributes the proton spin order to heteronuclei in the molecule. The fluid continues into a flow chemistry device where chemical processing (e.g., hydrolysis of an ester linkage) and then onto a separation device which removes the catalyst, released side-arm, unreacted molecules, side-reaction, and non-aqueous solvent. The purified hyperpolarized metabolite is collected and stored or dispensed for in-vivo use.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

Many variations and modifications may be made to the above-described embodiments. All such modifications and variations are intended to be included herein within the scope of this disclosure and protected by the following claims.

We claim:

1. A system, comprising:
   a precursor introduction device, wherein the precursor solution includes a target substrate molecule and a catalyst;
   a reaction chamber, wherein the precursor introduction device is configured to be in fluidic communication with the reaction chamber, wherein the reaction chamber includes an ultrasonic nozzle that has a surface, wherein the precursor introduction device is configured to deliver the precursor solution to the surface of the ultrasonic nozzle, wherein the ultrasonic nozzle is configured to produce droplets of the sample having an average diameter of from 1 to 50 microns in a droplet distribution range of about 25 microns or less, wherein the reaction chamber includes a collection structure; and
   a gas introduction system in communication with the reaction chamber, wherein the gas introduction system is configured to introduce parahydrogen into the reaction chamber, wherein the system is configured to expose the parahydrogen and the droplets of the precursor to one another, leading to the formation of the hyperpolarized fluid sample.

2. The system of claim 1, further comprising a device for spin order transfer from the protons to one or more heteronuclei.

3. The system of claim 2, wherein the device for spin order transfer is selected from one of the following: an NMR spectrometer configured for field cycling of the static magnetic field or radiofrequency field; an NMR spectrometer configured for coherence transfer radiofrequency pulse sequences; or an NMR spectrometer configured for adiabatic field cycling in conjunction with coherence transfer radiofrequency pulse sequences.

4. The system of claim 3, further comprising a device for chemical processing of the hyperpolarized fluid sample to form a processed hyperpolarized fluid, wherein the device for chemical processing is selected from one of the following: batch-mode hydrolysis device;

continuous-flow hydrolysis in a flow reactor system which combines the streams of hyperpolarized fluid with a solution of aqueous chemical base.

5. The system of claim 4, further comprising a separation device for processing the processed hyperpolarized fluid to separate a hyperpolarized fluid fraction from one or more of the following: a catalyst, side-reaction product, cleaved molecular fragments, and solvent residues.

6. The system of claim 1, further comprises a detection device that is in fluidic communication with the separation device, wherein the detection device is a nuclear magnetic resonance or magnetic resonance imaging device operating at low or zero magnetic field or high magnetic field.

7. The system of claim 1, wherein the system is operated in continuous or batch mode.

8. The system of claim 1, wherein the nuclear magnetic resonance spectrometer operating at low or high magnetic field is configured to carry out the redistribution of the parahydrogen-derived proton spin order to a heteronucleus and spin polarization analysis, optionally either in a batch or continuous flow operating mode.

9. The system of claim 1, wherein the precursor is a homogeneous fluid including the target molecule and a catalyst.

10. The system of claim 9, wherein the catalyst is in a liquid form.

11. The system of claim 10, wherein the catalyst is Rh or a Rh alloy, whether it be supported, tethered, or ligand stabilized in solution.

12. The system of claim 1, wherein the sample is a heterogeneous fluid including the target molecule and a particle comprising a catalyst.

13. The system of claims 12, wherein the catalyst is a Group VIII, IB, or IIB transition metal-based catalyst including at least two different metals or optionally wherein the catalyst does not include a metal.

14. The system of claim 13, wherein the catalyst comprises at least one of Pt, Pd, Cu, Au, Ag, Rh, Ru, Ir, Ni, Sn, Co, Zn, Ce, Ti, Al, Fe, Si or O.

15. The system of claim 12, wherein the catalyst is a nanoparticle having a diameter of about 10 to 500 nm.

16. The system of claim 1, wherein the target substrate molecule has a functional group selected from the group consisting of: a —OH, an amide, an amino, an amino acid, a sugar, a carboxylic acid, an ester, or an unsaturated side-arm precursor, and a combination thereof.

17. The system of claim 1, wherein the target substrate molecule is a metabolite for in-vivo or in-vitro administration.

18. The system of claim 17, wherein the metabolite is selected from the group consisting of: fumarate/fumaric acid, malate/malic acid, acetate, pyruvate, succinate, and arginine, and a combination thereof.

19. A method of detecting targeted molecules, comprising:

delivering a precursor solution onto a surface of an ultrasonic nozzle, wherein the precursor solution comprises a target molecule and a catalyst;

producing droplets of the precursor solution using an ultrasonic frequency from the ultrasonic nozzle, wherein the droplets have an average diameter of 1 to 50 microns in a droplet distribution range of about 25 microns or less;

mixing the droplets with parahydrogen to make a hyperpolarized fluid sample;

introducing the hyperpolarized fluid sample to a separation process which separates a hyperpolarized fluid fraction from one or more of a catalyst, a side-reaction product, cleaved molecular fragments, or solvent residues; and introducing the hyperpolarized fluid fraction to a detection device which uses magnetic resonance imaging for detection of the targeted molecule within the hyperpolarized fluid fraction.

20. The method of claim 19, wherein the ultrasonic frequency is about 20 kHz to 3 MHz.

\* \* \* \* \*